(12) United States Patent
Hauhe et al.

(10) Patent No.: US 9,218,989 B2
(45) Date of Patent: Dec. 22, 2015

(54) AEROGEL DIELECTRIC LAYER

(75) Inventors: Mark S. Hauhe, Hermosa, CA (US);
Jason G. Milne, Hawthorne, CA (US);
Terry C. Cisco, Glendale, CA (US);
Paul Nahass, Cambridge, MA (US);
George Gould, Mendon, MA (US);
Nick Zafiropoulos, Wayland, MA (US)

(73) Assignees: RAYTHEON COMPANY, Waltham, MA (US); ASPEN AEROGELS, INC., Northborough, MA (US)

( * ) Notice: Subject to any disclaimer, the term of this patent is extended or adjusted under 35 U.S.C. 154(b) by 231 days.

(21) Appl. No.: 13/200,477

(22) Filed: Sep. 23, 2011

(65) Prior Publication Data

US 2013/0075795 A1    Mar. 28, 2013

(51) Int. Cl.
*H01L 21/56* (2006.01)
*H01L 23/29* (2006.01)

(52) U.S. Cl.
CPC ............ *H01L 21/563* (2013.01); *H01L 23/293* (2013.01); *H01L 2924/0002* (2013.01)

(58) Field of Classification Search
USPC ............... 257/787–788, 792, 701, 778, 790, 257/E23.116, E23.126, E23.117
See application file for complete search history.

(56) References Cited

U.S. PATENT DOCUMENTS

| | | | |
|---|---|---|---|
| 5,750,415 A | 5/1998 | Gnade et al. | |
| 5,948,482 A | 9/1999 | Brinker et al. | |
| 6,656,527 B1 | 12/2003 | Gessner et al. | |
| 6,670,402 B1 | 12/2003 | Lee et al. | |
| 6,774,493 B2 * | 8/2004 | Capote et al. | 257/778 |
| 6,913,946 B2 | 7/2005 | Lin | |
| 7,071,287 B2 | 7/2006 | Rhine et al. | |
| 7,074,880 B2 | 7/2006 | Rhine et al. | |
| 7,193,009 B2 * | 3/2007 | Amou et al. | 524/575 |
| 7,780,890 B2 | 8/2010 | Lee et al. | |
| 8,338,945 B2 * | 12/2012 | Yu et al. | 257/737 |
| 2005/0006766 A1 | 1/2005 | Nakayoshi et al. | |
| 2005/0192366 A1 | 9/2005 | Ou et al. | |
| 2005/0192367 A1 | 9/2005 | Ou et al. | |
| 2006/0084707 A1 | 4/2006 | Ou et al. | |
| 2006/0246806 A1 | 11/2006 | Rhine et al. | |
| 2006/0264132 A1 | 11/2006 | Leeser et al. | |
| 2006/0264133 A1 | 11/2006 | Krajewski et al. | |
| 2006/0269734 A1 | 11/2006 | Krajewski et al. | |
| 2006/0286360 A1 | 12/2006 | Rhine et al. | |
| 2007/0152363 A1 | 7/2007 | Begag et al. | |

(Continued)

FOREIGN PATENT DOCUMENTS

JP    2000 154273 A    6/2000

OTHER PUBLICATIONS

Gottfried et al., "Cu/Barrier CMP on Porous Low-*k* Based Interconnect Schemes", Microelectronic Engineering, Elsevier Publishers BV., Amsterdam, NL, vol. 83, No. 11-12, Nov. 1, 2006 (pp. 2218-2224).

(Continued)

*Primary Examiner* — Jose R Diaz
(74) *Attorney, Agent, or Firm* — Christie, Parker & Hale, LLP

(57) ABSTRACT

A circuit board assembly includes a circuit board, a chip attached to the circuit board and a dielectric layer. The chip has a circuit facing the circuit board and spaced from it. The dielectric layer includes an aerogel. In one embodiment, the aerogel has a dielectric constant of approximately 2.0 or less and a compression strength of at least approximately 100 psi.

23 Claims, 8 Drawing Sheets

(56) References Cited

U.S. PATENT DOCUMENTS

| | | |
|---|---|---|
| 2007/0259979 A1 | 11/2007 | Lee |
| 2008/0014402 A1 | 1/2008 | Tomich |
| 2009/0029147 A1 | 1/2009 | Tang et al. |
| 2009/0229032 A1 | 9/2009 | Stepanian et al. |
| 2010/0110651 A1* | 5/2010 | Goetz et al. .................. 361/783 |
| 2010/0155644 A1 | 6/2010 | Ou et al. |
| 2011/0074012 A1 | 3/2011 | Itoh |
| 2011/0226041 A1 | 9/2011 | Cummins |
| 2012/0067871 A1* | 3/2012 | Sherrer et al. ................ 219/678 |

OTHER PUBLICATIONS

Extended European Search Report from European Application No. 12177541.5-1552, European Search Report dated Jan. 16, 2015 and mailed Jan. 26, 2015 (7 pgs.)

* cited by examiner

FIG. 3

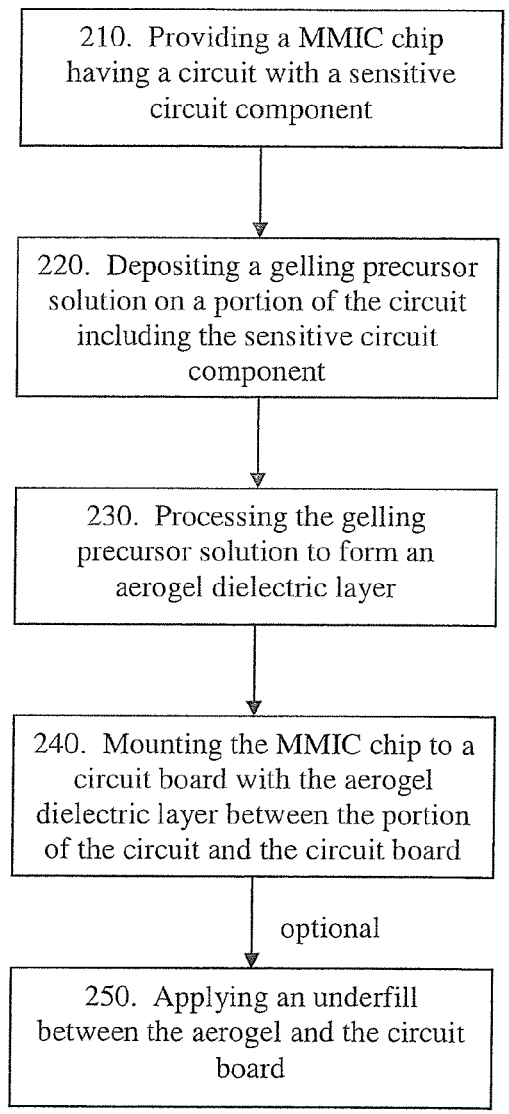

200. Process for preparing a MMIC flip chip system having an aerogel dielectric layer

- 210. Providing a MMIC chip having a circuit with a sensitive circuit component
- 220. Depositing a gelling precursor solution on a portion of the circuit including the sensitive circuit component
- 230. Processing the gelling precursor solution to form an aerogel dielectric layer
- 240. Mounting the MMIC chip to a circuit board with the aerogel dielectric layer between the portion of the circuit and the circuit board optional

- 250. Applying an underfill between the aerogel and the circuit board

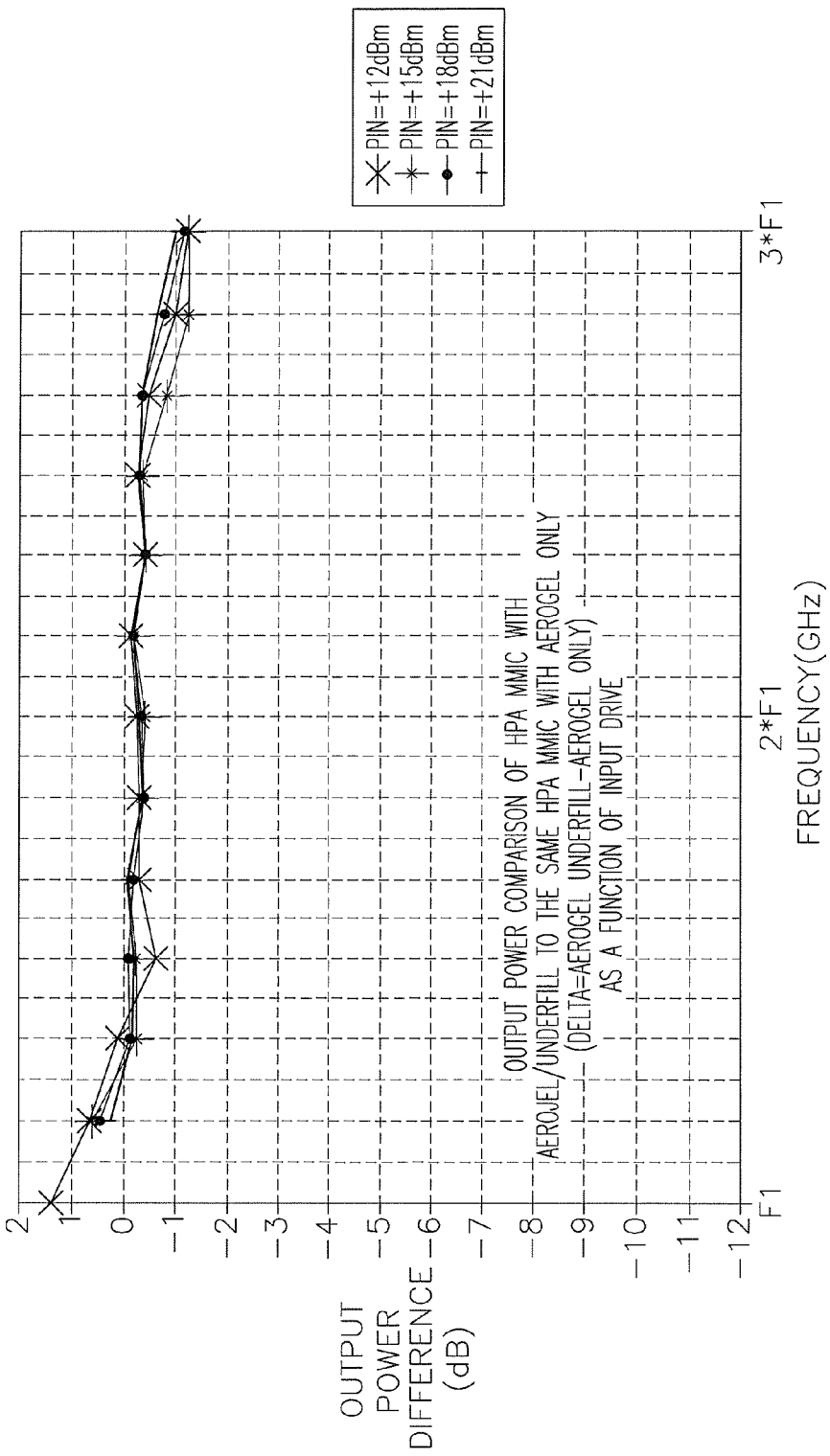

US 9,218,989 B2

AEROGEL DIELECTRIC LAYER

FIELD

The present invention relates generally to aerogel dielectric layers, and more specifically, to aerogel dielectric layers having regions disposed on integrated circuit chips.

BACKGROUND OF THE INVENTION

Monolithic microwave integrated circuit ("MMIC") chips are often mounted on a circuit board by metal or solder posts to form a MMIC chip system. When a MMIC chip is mounted with the circuits facing the circuit board, it is referred to as a "MMIC flip chip system." The difference in thermal expansion properties between the MMIC flip chip and the circuit board can create mechanical stresses on the metal or solder posts when the system experiences temperature cycles or large thermal fluctuations. These stresses may render the system unreliable.

A conventional solution is to insert an underfill material having desirable mechanical properties between the MMIC flip chip and the circuit board to reduce the stresses on the metal or solder posts. However, due to undesirable dielectric properties, underfill contacting sensitive components of the MMIC flip chip can degrade the electrical performance of the chip.

Prior solutions to this problem include using tall metal or solder posts that provide sufficient flexibility during thermal expansion to alleviate the need for underfill. Another approach is to apply underfill carefully to avoid the sensitive components of the MMIC flip chip. Both of these approaches require non-standard processes and are therefore unavailable or expensive to implement.

SUMMARY

Aspects of the invention relate to an aerogel dielectric layer on integrated circuit chips. In one embodiment, the invention relates to an aerogel dielectric layer having regions in which the aerogel dielectric layer regions respectively cover the sensitive components between the flip chip and the circuit board and are laterally separated from each other. In another embodiment, the flip chip is a monolithic microwave integrated circuit ("MMIC") flip chip.

In one embodiment, the aerogel has a dielectric constant of approximately 2.0 or less and a compression strength of at least approximately 100 psi. In another embodiment, the aerogel has a dielectric constant of approximately 1.5 or less and a compression strength of at least approximately 100 psi. In another embodiment, the aerogel has a density of approximately 0.05 g/cc to 0.30 g/cc, and a compression strength of approximately 100 psi to 400 psi. In yet another embodiment, the aerogel has a dielectric constant of approximately 1.15 to 1.40, a density of approximately 0.10 g/cc to 0.25 g/cc, and a compression strength of approximately 100 psi to 360 psi.

The aerogel may have a loss tangent of approximately 0.002 to 0.007, and the aerogel dielectric layer regions may be approximately 5 μm to 20 μm thick.

The MMIC flip chip may be fixed to the circuit board by one or more solder bumps or solder posts. In another embodiment, an underfill material may be applied between the MMIC flip chip and the circuit board. In another embodiment, an underfill is between the MMIC flip chip and the circuit board, the underfill being disposed between the aerogel dielectric layer regions and connected to the circuit board and the flip chip at locations between the aerogel dielectric layer regions.

The invention relates to a method for preparing aerogel dielectric layer regions on portions of a flip chip, the method including depositing a gelling precursor solution on the portions of the flip chip including sensitive components so as to respectively cover the sensitive components, processing the gelling precursor solution to form an aerogel dielectric layer region comprising an aerogel on each respective portion of the flip chip, mounting the circuit to a circuit board such that the aerogel dielectric layer regions are between the flip chip and the circuit board, and applying an underfill between the circuit and the circuit board, wherein the underfill is disposed between the aerogel dielectric layer regions and is connected to the circuit board and the flip chip at locations between the aerogel dielectric layer regions.

BRIEF DESCRIPTION OF THE DRAWINGS

FIG. 3 is a flow chart showing a method for preparing a MMIC flip chip system having a plurality of aerogel dielectric layer regions in accordance with one embodiment of the invention.

FIGS. 4A and 4B are graphs comparing the performance of MMIC flip chips without and with aerogel dielectric layer regions.

DETAILED DESCRIPTION

Figure 1:
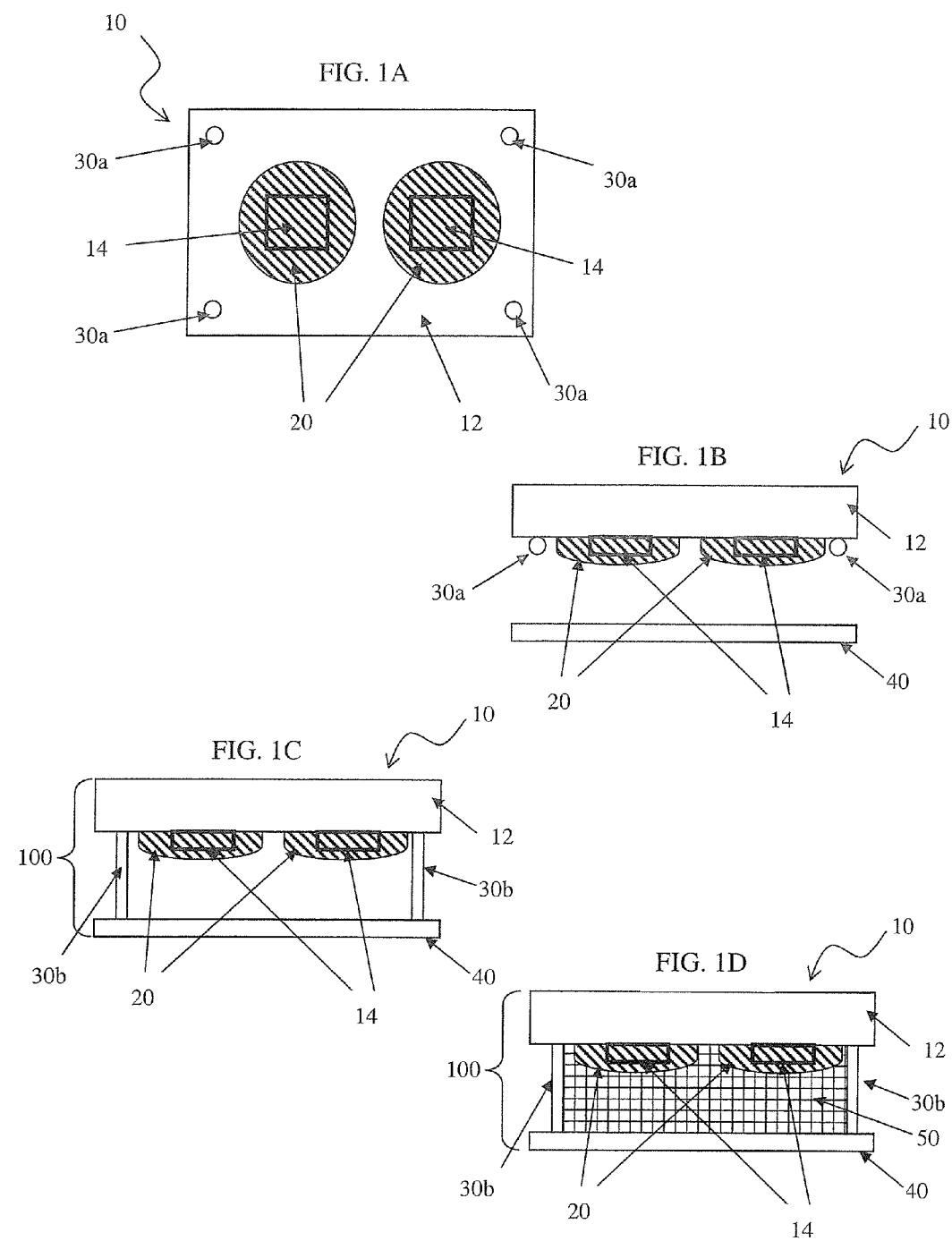
FIG. 1A is a schematic plan view of a monolithic microwave integrated circuit ("MMIC") flip chip having aerogel dielectric layer regions respectively covering selected areas in accordance with one embodiment of the invention.
FIG. 1B is a schematic partially cross-sectional diagram of the MMIC flip chip shown in FIG. 1a positioned over a circuit board.
FIG. 1C is a schematic partially cross-sectional diagram of the MMIC flip chip and circuit board shown in FIG. 1b mounted by solder posts.
FIG. 1D is a schematic partially cross-sectional diagram of the MMIC flip chip and circuit board shown in FIG. 1c with underfill disposed between the MMIC flip chip and the circuit board.

Referring now to the drawings, embodiments of aerogel dielectric layer regions are incorporated into a MMIC flip chip system including a MMIC flip chip mounted to a circuit board. The circuit board may include any of a variety of known board types, including without limitation, printed circuit boards, printed wiring boards, hybrid boards, and the like. For convenience, the term "circuit board" will be used to refer to any of those types of boards with which the invention is used. In the invention, the aerogel dielectric layer regions are disposed between sensitive components of the MMIC flip chip, for example field-effect transistors ("FETs"), and the circuit board. In MMIC flip chip systems including an underfill between the MMIC flip chip and the circuit board, the aerogel dielectric layer regions are disposed between sensitive components of the MMIC flip chip and the underfill.

As shown in FIG. 1A, the MMIC flip chip 10 includes a chip 12 containing at least one FET 14 and a plurality of solder bumps 30a. An aerogel dielectric layer has regions of contact with the MMIC flip chip 10 and does not cover the entire MMIC flip chip. The aerogel dielectric layer regions 20 respectively cover portions of the surface of the MMIC flip chip 10, including the FETs 14 and any other sensitive components (not shown).

FIG. 1B shows the components of the MMIC flip chip 10 including the FETs 14 and the plurality of solder bumps 30a facing the circuit board 40. The aerogel dielectric layer regions 20 respectively cover the FETs 14 at locations between the FETs 14 and the circuit board 40.

FIG. 1C shows the MMIC flip chip 10 mounted to the circuit board 40 to form a MMIC flip chip system 100. The plurality of solder bumps 30a are heated or otherwise liquefied to form a plurality of solder posts 30b that connect the chip 12 to the circuit board 40. The plurality of solder posts 30b are sized such that the aerogel dielectric layer regions 20 and any other components (not shown) of the MMIC flip chip 10 are spaced apart from the circuit board 40. In one embodiment, the gap between the MMIC flip chip and the circuit board is approximately 100 to 150 μm.

As shown in FIG. 1D, the MMIC flip chip system 100 further includes an underfill 50 between the MMIC flip chip 10 and the circuit board 40. The underfill is disposed between the aerogel dielectric layer regions and is connected to the circuit board and the MMIC flip chip at locations between the aerogel dielectric layer regions. The aerogel dielectric layer regions 20 prevent the underfill 50 from contacting the FETs 14 and other sensitive components (not shown).

Figure 2:
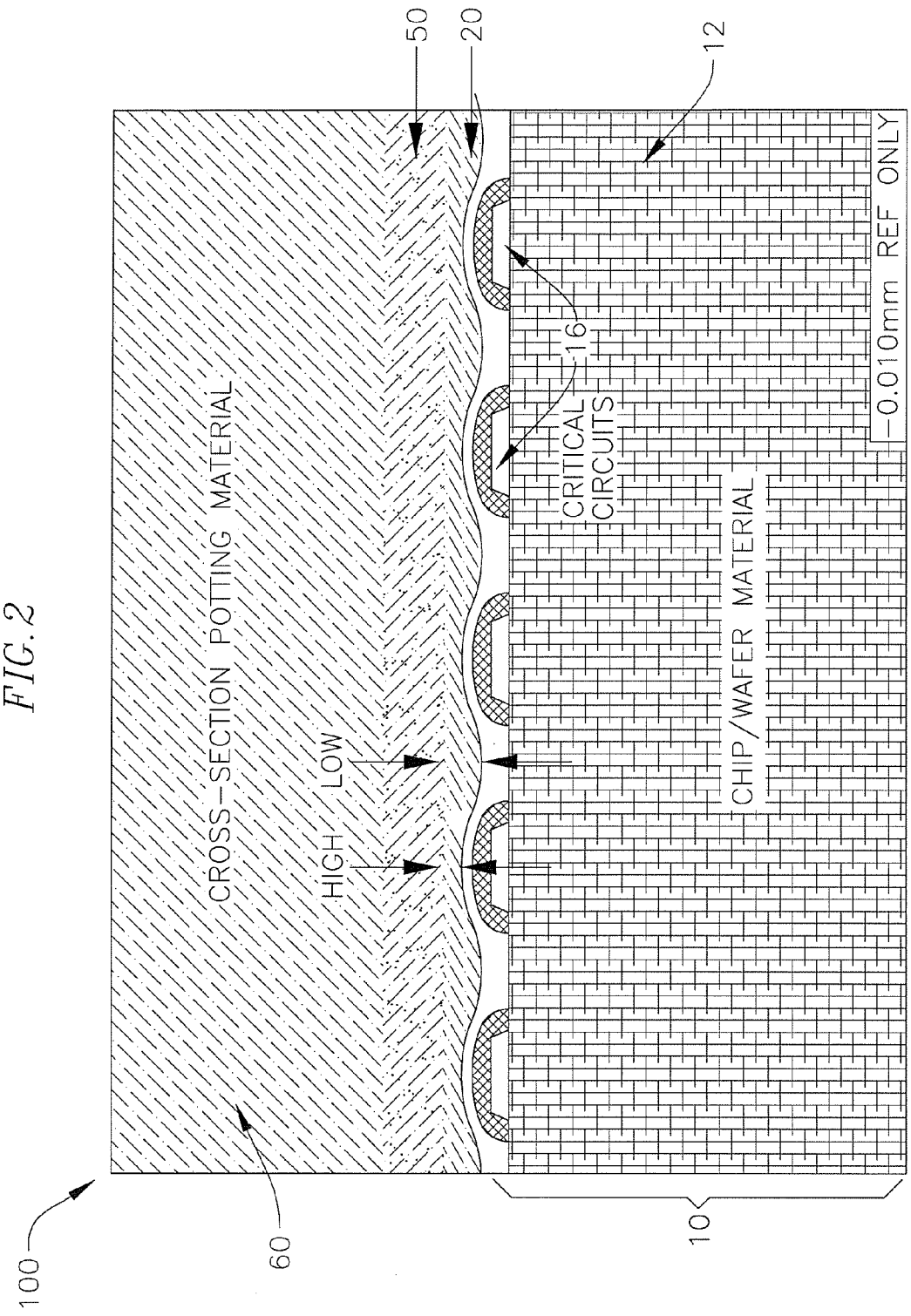
FIG. 2 is a cross-sectional view of a MMIC flip chip mounted on a circuit board showing aerogel dielectric layer regions covering selected areas of the MMIC flip chip and an underfill between the MMIC flip chip and the circuit board.

FIG. 2 illustrates a MMIC flip chip system 100 including a MMIC flip chip 10 having a chip 12 supporting a plurality of critical circuits 16. The aerogel dielectric layer regions 20 cover the plurality of critical circuits 16 and prevent the underfill 50 from contacting the plurality of critical circuits 16. The MMIC flip chip system 100 further includes a potting material 60 to reduce shock and vibration and to exclude moisture and corrosive materials.

FIG. 3 is a flow chart showing a process 100 for preparing a MMIC flip chip system having a plurality of aerogel dielectric layer regions in accordance with one embodiment of the invention. In particular, the process 200 can be used to prepare a MMIC flip chip system 100 as shown in FIGS. 1A-1D. The process 200 includes providing 210 a MMIC flip chip having a plurality of sensitive components. The process further includes depositing 220 a gelling precursor solution on the portions of the MMIC flip chip including the sensitive components, for example FETs. The gelling precursor solution may be deposited by any suitable process such as, for example, spin coating, stencil printing or dot dispensing. In one embodiment, the gelling precursor solution is deposited by dot dispensing. The gelling precursor solution is then processed 230 on the portions of the MMIC flip chip including the sensitive components to form aerogel dielectric layer regions respectively covering those portions of the MMIC flip chip circuit. The processing may include drying by any suitable process, for example, supercritical $CO_2$ drying at 55° C. and 1600 psi. The process includes mounting 240 the MMIC flip chip to a circuit board such that the aerogel dielectric layer regions are positioned between the MMIC flip chip and the circuit board. The mounting may include providing solder bumps or solder posts to attach the MMIC flip chip to the circuit board. The process optionally includes applying 250 an underfill between the MMIC flip chip and the circuit board, wherein the underfill is disposed between the dielectric layer regions and is connected to the circuit board and the flip-chip at locations between the dielectric layer regions.

The underfill fills the gap between the MMIC flip chip and the circuit board through capillary action, and is then hardened. In one embodiment, the underfill is an epoxy that is hardened by curing.

Adhesion of the underfill to the MMIC flip chip relies partially on contact between the underfill and the MMIC flip chip itself. Therefore, in many embodiments, the aerogel dielectric layer has regions of contact with the MMIC flip chip and does not cover the entire MMIC flip chip. However, materials having a high dielectric constant, such as underfill, placed adjacent sensitive components of the MMIC flip chip, such as FETs, tend to degrade performance of the MMIC flip chip by interfering with electric fields created during its operation. An aerogel having a low dielectric constant reduces the extent of any interference with these electric fields, and therefore reduces any adverse impact on the MMIC flip chip performance. Performance degradation due to close proximity to a high dielectric constant underfill can be reduced by providing aerogel dielectric layer regions having a dielectric constant of approximately 2.0 or less and a thickness of approximately 5 μm to 20 μm disposed between at least those portions of the MMIC flip chip having sensitive components and the underfill. In one embodiment, the aerogel of the aerogel dielectric layer regions has a dielectric constant of approximately 1.5 or less.

Figure 4A:
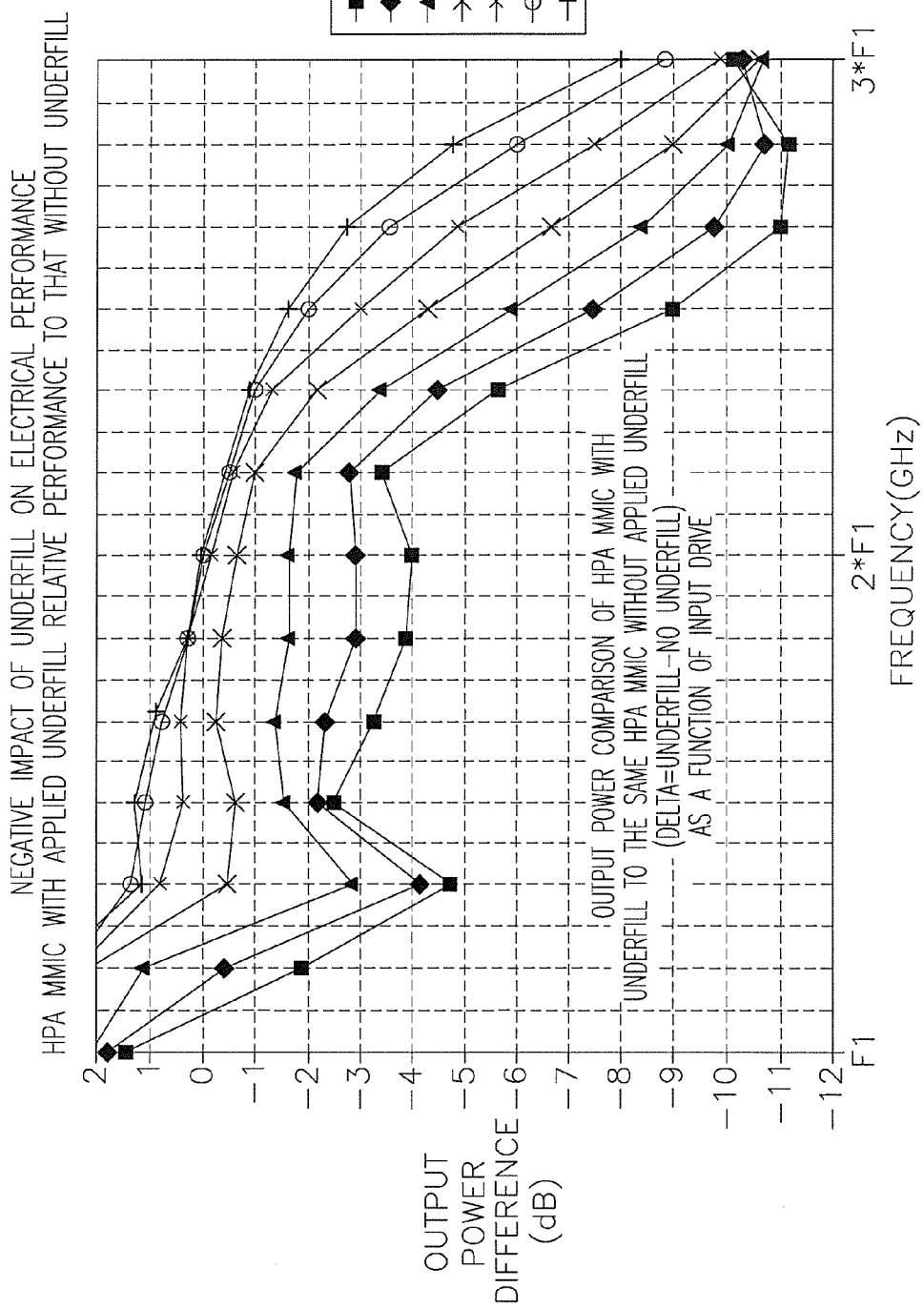

FIG. 4A shows the output power difference between seven flip chips having an underfill and the same flip chips without an underfill. As shown, the output power is significantly compromised when underfill is applied. FIG. 4B shows the output power difference between four flip chips having aerogel dielectric layer regions, for example as shown in FIG. 1C, and the same flip chips having aerogel dielectric layer regions and underfill, for example as shown in FIG. 1D. As shown, the output power difference with and without underfill is small when aero gel dielectric layer regions are present. The impact of underfill is therefore reduced with aerogel layer regions between the flip chip and the underfill.

Figure 5:
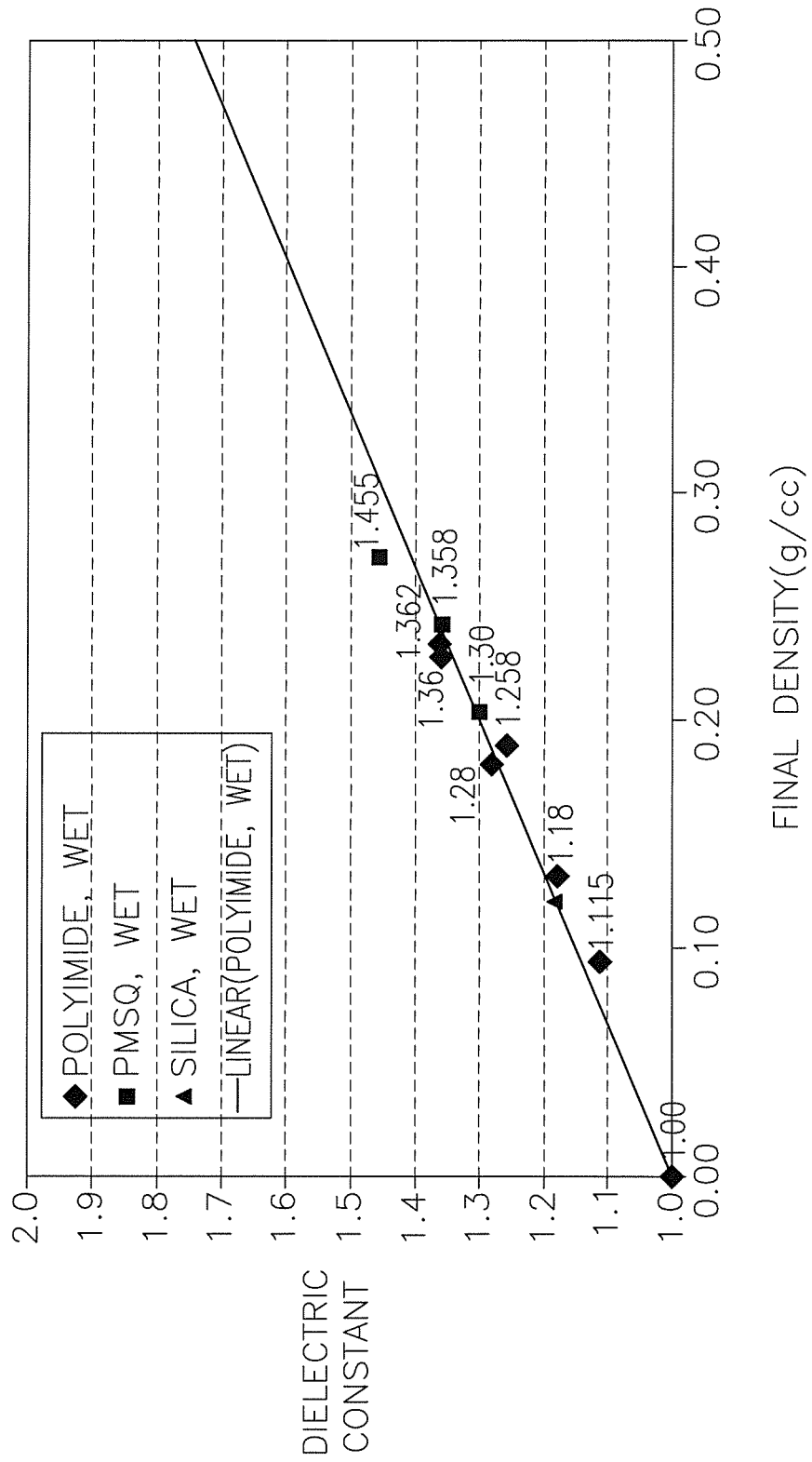
FIG. 5 is a graph showing the relationship between density and dielectric constant for three types of aerogels.

In one embodiment, the aero gel of the aerogel dielectric layer regions has a density of approximately 0.05 g/cc to 0.30 g/cc. FIG. 5 is a graph showing the relationship between density and dielectric constant for three types of aerogels. Polyimide, PMSQ and silica aerogel samples having densities of approximately 0.05 g/cc to 0.30 g/cc all had dielectric constants below 1.5.

Figure 6:
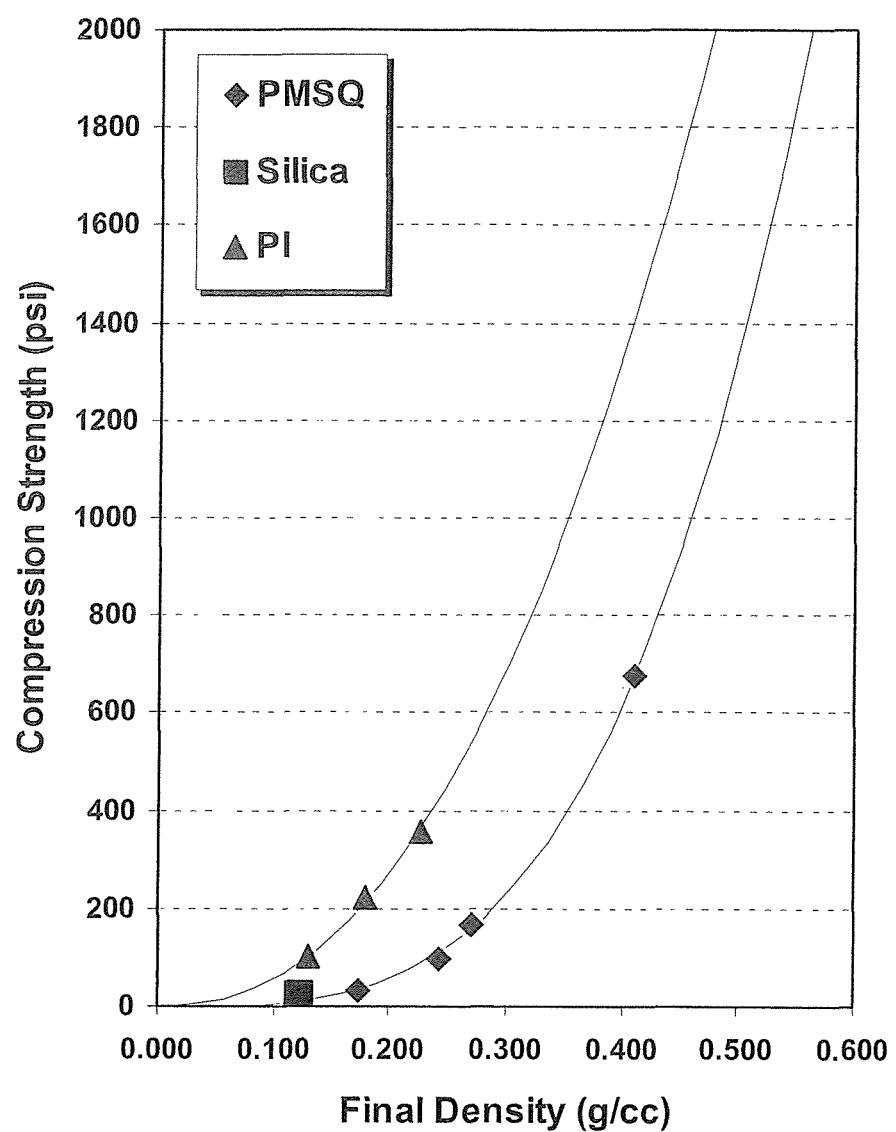
FIG. 6 is a graph showing the relationship between density and compression strength for three types of aerogels.

The aerogel of the aerogel dielectric regions must be strong enough to support itself in place during the processes leading up to the underfill application. The aerogel of the aerogel dielectric regions must also be strong enough to resist the flow of underfill during the underfill application so that the aerogel dielectric layer regions remain in place over the sensitive components of the MMIC flip chip. In one embodiment, the aerogel of the aerogel dielectric layer regions has a compression strength of at least approximately 100 psi. In another embodiment, the compression strength of the aero gel of the aero gel dielectric regions is approximately 100 psi to 400 psi. FIG. 6 shows the relationship between density and compression strength for three types of aerogels. Polyimide (PI) shows the highest compression strength for a given density compared with silica and PMSQ.

Figure 7:
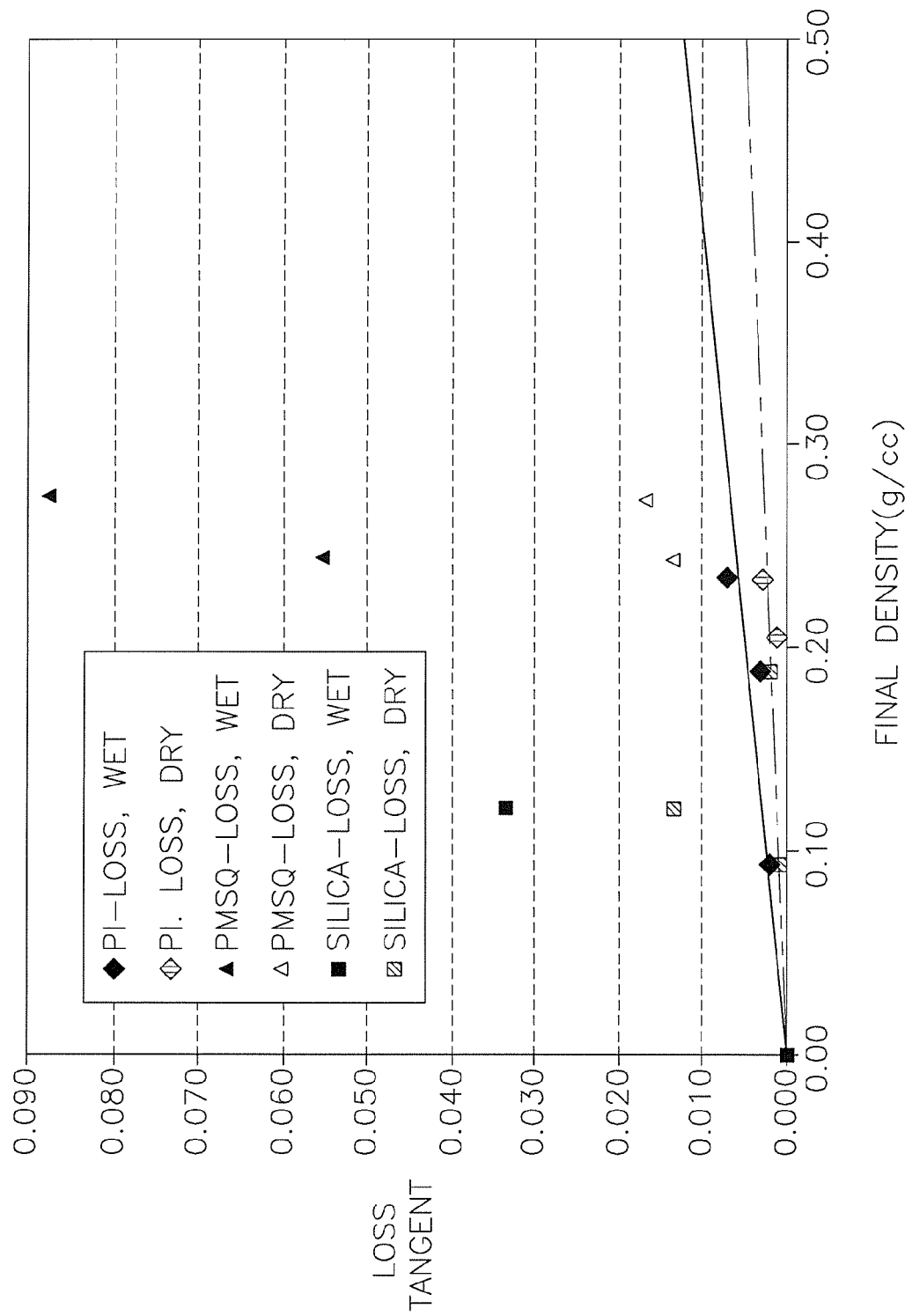
FIG. 7 is a graph showing the relationship between density and loss tangent for three types of aerogels.

The aerogel of the aerogel dielectric layer regions may have a loss tangent of approximately 0.002 to 0.007. A low loss tangent is desirable because it reduces the rate at which electromagnetic energy is dissipated. FIG. 7 is a graph showing the relationship between density and loss tangent for three types of aerogels. Polyimide (PI) exhibits a lower loss tangent than either PMSQ or silica over the desired range of densities.

Table 1 shows properties for three samples of polyimide aerogels. These three samples exhibit a dielectric constant of approximately 1.15 to 1.40, a density of approximately 0.10 g/cc to 0.25 g/cc and a compression strength of approximately 100 psi to 360 psi.

TABLE 1

| | Dielectric Constant | Density (g/cc) | Compression Strength (psi) |
|---|---|---|---|
| PI-3 | 1.18 | 0.131 | 101.6 |
| PI-4 | 1.36 | 0.227 | 356.8 |
| PI-5 | 1.28 | 0.180 | 220.7 |

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A circuit board assembly comprising:
a circuit board;
a flip-chip attached to the circuit board, the flip-chip having a plurality of sensitive components hieing, the circuit board and spaced from the circuit board in a flip-chip configuration;
a plurality of dielectric layer regions respectively covering the plurality of sensitive components between the flip-chip and the circuit board, wherein the dielectric layer regions are laterally separated and comprise an aerogel; and
an underfill between the flip-chip and the circuit board, the underfill disposed between the dielectric layer regions and connected to the circuit board and the flip-chip at locations between the dielectric layer regions.

2. The circuit board assembly according to claim 1, wherein the aerogel has a dielectric constant of approximately 2.0 or less.

3. The circuit board assembly according to claim wherein the aerogel has a dielectric constant of approximately 1.5 or less.

4. The circuit board assembly according to claim 1, wherein the aerogel has a compression strength of at least approximately 100 psi.

5. The circuit board assembly according to claim 1, wherein the aerogel has a compression strength of approximately 100 psi to 400 psi.

6. The circuit board assembly according to claim 1, wherein the aerogel has a density of approximately 0.05 g/cc to 0.30 g/cc.

7. The circuit board assembly according to claim 1, wherein the flip-chip comprises a monolithic microwave integrated circuit, the monolithic microwave integrated circuit comprising a field-effect transistor, wherein the plurality of sensitive components includes the field-effect transistor.

8. The circuit board assembly according to claim 1, wherein an underfill is applied between the flip-chip and the circuit board and wherein the aerogel is disposed between the underfill and the plurality of sensitive components facing the circuit board.

9. The circuit board assembly according to claim 1, wherein the aerogel has a dielectric constant of approximately 1.15 to 1.40, a density of approximately 0.10 g/cc to 0.25 g/cc, and a compression strength of approximately 100 psi to 360 psi.

10. The circuit board assembly according to claim 1, wherein the aerogel has a loss tangent of approximately 0.002 to 0.007.

11. The circuit board assembly according to claim 1, wherein the thickness of the dielectric layer is approximately 5 μm to 20 μm.

12. The circuit board assembly according to claim 7, wherein the monolithic microwave integrated circuit is fixed to the circuit board by one or more solder bumps or solder posts, wherein an underfill is applied between the monolithic microwave integrated circuit and the circuit hoard, and wherein the aerogel is disposed between the underfill and the field-effect transistor.

13. A method for preparing a plurality of dielectric layer regions for a plurality of sensitive components on a flip-chip facing a circuit board and spaced apart from the circuit board in a flip-chip configuration, the method comprising:
applying an aerogel over the plurality of sensitive components to respectively cover the plurality of sensitive components, wherein the dielectric layer regions are laterally separated; and
applying an underfill between the flip-chip and the circuit board, wherein the underfill disposed between the dielectric layer regions and is connected to the circuit board and the flip-chip at locations between the dielectric layer regions.

14. The method according to claim 13, wherein the aerogel is applied by:
depositing a gelling precursor solution on the plurality of sensitive components that are configured to face the circuit board;
processing the gelling precursor solution to form the plurality of dielectric layer regions comprising the aerogel on the plurality of sensitive components, wherein the dielectric layer regions respectively Cover the sensitive components and the dielectric layer regions are laterally separated; and
mounting the flip-chip to the circuit board in a flip-chip configuration such that the sensitive components face the circuit board and the dielectric layer regions are between the sensitive components and the circuit board.

15. The method according to claim 13, wherein the aerogel has a dielectric constant of approximately 2.0 or less and a compression strength of at least approximately 100 psi.

16. The method according to claim 13, wherein the aerogel has a dielectric constant of approximately 1.5 or less, a density of approximately 0.05 g/cc to 0.30 g/cc, and a compression strength of approximately 100 psi to 400 psi.

17. The method according to claim 13, wherein the aerogel has a dielectric constant of approximately density of approximately 0.10 g/cc to 0.25 g/cc, and a compression strength of approximately 100 psi to 360 psi.

18. The method according to claim 13, wherein the gelling precursor solution is deposited by spin coating, stencil priming or dot dispensing.

19. The method according to claim 13, wherein the gelling precursor solution is deposited by dot dispensing.

20. The method according to claim 13, wherein the gelling precursor solution is applied to a field effect transistor.

21. The method according to claim 13, wherein the aerogel has a loss tangent of approximately 0.002 to 0.007.

22. The circuit board assembly according to claim 1, wherein the underfill disposed between the plurality of dielectric layer regions and directly connected to the circuit board and the flip-chip at the locations between the plurality of dielectric layer regions.

23. The method according to claim 13, wherein the underfill is disposed between the dielectric layer regions and is directly connected to the circuit board and the flip-chip at locations between the dielectric layer regions.

\* \* \* \* \*